Feb. 16, 1971 G. R. WILSON 3,564,356

HIGH VOLTAGE INTEGRATED CIRCUIT TRANSISTOR

Filed Oct. 24, 1968

GEORGE R. WILSON
*INVENTOR*

*BY*

*BUCKHORN, BLORE, KLARQUIST & SPARKMAN*
*ATTORNEYS*

United States Patent Office 3,564,356

Patented Feb. 16, 1971

3,564,356

HIGH VOLTAGE INTEGRATED CIRCUIT TRANSISTOR

George R. Wilson, Beaverton, Oreg., assignor to Tektronix, Inc., Beaverton, Oreg., a corporation of Oregon Filed Oct. 24, 1968, Ser. No. 770,303
Int. Cl. H01l 5/00
U.S. Cl. 317—235 7 Claims

ABSTRACT OF THE DISCLOSURE

An integrated circuit transistor includes a substrate and an epitaxially grown semiconductor material thereon providing a three-layer transistor comprising a collector layer, an emitter layer, and a base layer therebetween. The collector layer is characterized by virtually complete depletion of majority carriers at a collector-emitter voltage less than the voltage at which collector-emitter breakdown would otherwise occur. As a result, the collector-emitter voltage may be increased without encountering normal collector-emitter breakdown, because the field intensity in the collector-base charge layer is limited.

BACKGROUND OF THE INVENTION

Typical collector-to-emitter breakdowns of integrated transistors are caused by multiplication of $I_{CBO}$, or leakage current, by transistor action and subsequent avalanche multiplication of this current in the collector-base space charge layer. Minority carriers traversing the collector region receive enough energy and acceleration to cause impact ionization whereby breakdown occurs. The collector-emitter voltage is, of course, normally limited by this breakdown voltage, $BV_{CEO}$.

SUMMARY OF THE INVENTION

According to the present invention, the collector in an integrated circuit transistor configuration is substantially depleted of majority carriers at a voltage less than the characteristic collector-emitter breakdown voltage. The collector material and doping thereof is chosen such that such depletion takes place before breakdown. As a result, the field intensity is limited in the collector-base space charge layer whereby carriers traversing the region will not receive enough energy to cause impact ionization even though the collector-emitter voltage is raised further than the characteristic collector-emitter breakdown value. As a consequence, a transistor is provided which is operative at high collector-emitter voltages, even up to the voltage at which the back-biased collector-base junction itself breaks down.

According to a preferred form of the present invention, the integrated transistor is formed directly upon a substrate providing a junction with the collector which is back-biased such as to limit the active collector region. In this manner, it is possible advantageously to reduce the effective collector region thickness in value whereby such region will be effectively depleted of charge below the normal collector-emitter breakdown voltage for the type of transistor.

It is accordingly an object of the present invention to provide an improved transistor for operation at higher collector-emitter voltages.

It is a further object of the present invention to provide an improved integrated transistor operative at voltages above what would normally be considered breakdown voltage.

It is a further object of the present invention to provide a method of operating a transistor at voltages above what would otherwise be considered breakdown values.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

DETAILED DESCRIPTION

Figures 1, 2:
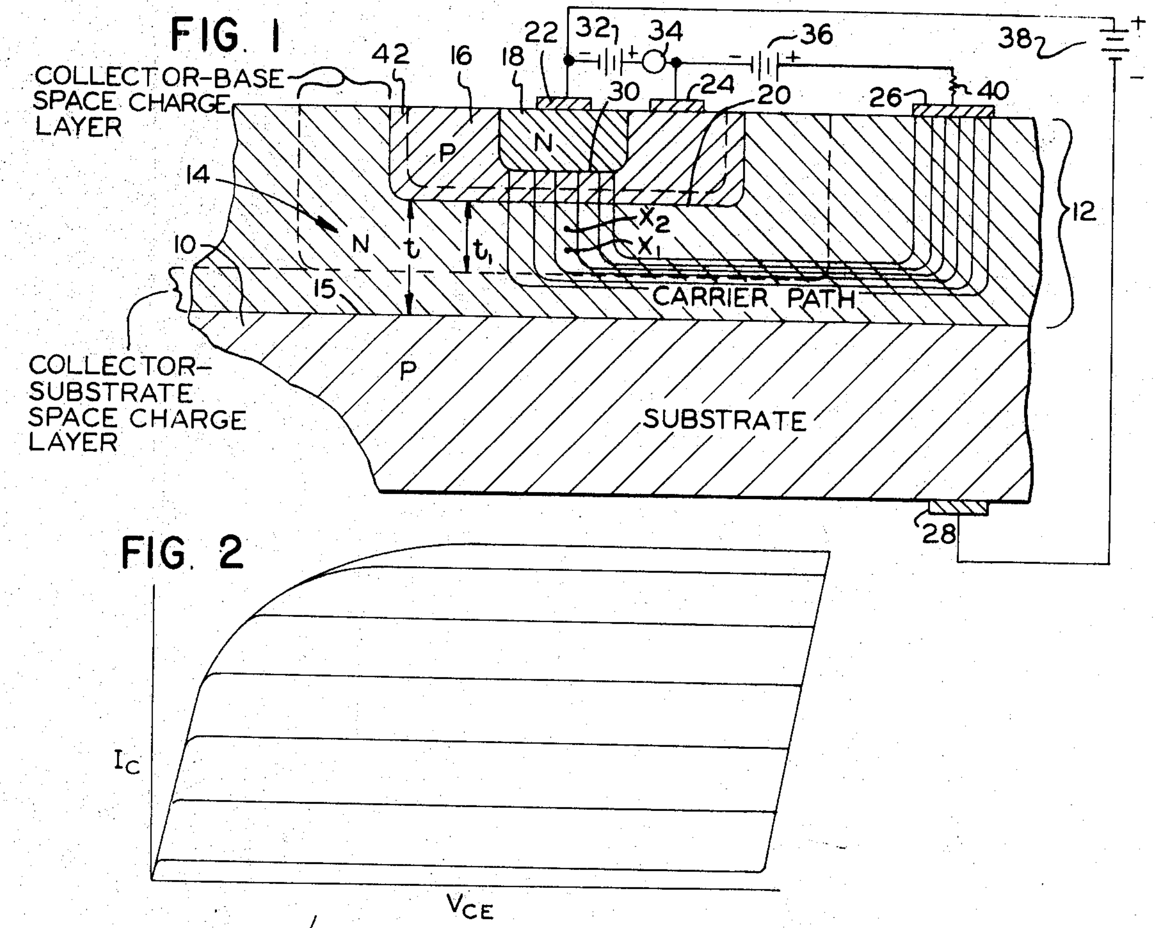
FIG. 1 is a partially broken-away cross sectional view of an integrated transistor according to the present invention, further including circuitry elements connected therewith.
FIG. 2 is a plot of D.C. common-emitter characteristics for a transistor in accordance with the present invention.

As illustrated in FIG. 1, an integrated circuit transistor in accordance with an embodiment of the present invention is provided with a substrate member 10 of semiconductor material which may be a part of a monolithic circuit including a plurality of other transistors (not shown). The substare member 10 may be P type silicon having a resistivity of 10 ohm-centimeters. Layer 12, formed of N type semiconductor material and suitably having a substantially uniform resistivity of one ohm-centimeter, is provided on the upper surface of the substrate member such as by epitaxial growth with suitable impurity doping. This layer provides the collector region 14 of the transistor and is directly adjacent the P-type substrate without use of an intermediate layer, or buried layer, therebetween. Layer 12 suitably has a thickness of approximately five microns. Base and emitter layers or regions 16 and 18 are provided by diffusing appropriate doping material into the epitaxial layer in the usual manner whereby the depth of the collector-base junction 20 is approximately 1.5 microns below the top surface of the device. The sheet resistance of the base is approximately 200 ohms per square, with the emitter being approximately one micron deep and having a sheet resistance of ten ohms per square. The base is doped much more heavily than the collector. Contact 22 provides connection with the emitter region while contacts 24, 26, and 28 provide connection with the base, collector, and substrate regions respectively.

Figure 5:
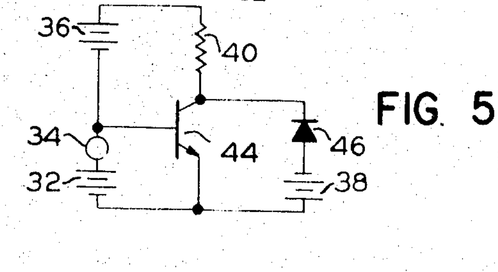
FIG. 5 is a circuit substantially equivalent to the circuit of the FIG. 1 transistor.

The base-emitter junction 30 is forward-biased by a battery 32 in series with a signal source or the like 34 disposed between contacts 22 and 24. The collector-base junction 20 is back-biased by means of battery 36, while the collector-substrate junction 15 is similarly back-biased with battery 38. A load resistor 40 connects battery 36 to contact 26. A substantially equivalent circuit for the FIG. 1 transistor is illustrated schematically in FIG. 5. Here the reference numeral 44 indicates the transistor structure of FIG. 1, and reference numeral 46 indicates the collector-substrate semiconductor junction.

The thickness *t* of the active collector region, i.e., the collector region beneath the emitter, and the resistivity resulting from doping thereof, are chosen such that the collector region is virtually depleted of majority carriers at a collector-emitter voltage (provided by batteries 32 and 36) which is less than the voltage at which the breakdown occurs or would occur if such provision was not made to remove virtually all majority carriers from the collector region. This depletion extends substantially across the thickness, $t$, of the collector region. This compares with the usual transistor, wherein the collector region is thick enough or the doping is high enough so that complete depletion of majority carriers does not occur. Moreover, a "buried" layer is frequently provided under the collector of the usual integrated transistor which in effect supplies additional majority carriers. When complete depletion is accomplished in accordance with the present invention, and the collector-emitter voltage is raised above the value at which such depletion occurs, the field intensity in the collector-base space charge layer remains unchanged. Therefore minority carriers traversing the region will not receive increased energy as the voltage is raised and will not cause impact ionization. As a result, the voltage can be raised above the value at which collector-emitter breakdown would be indicated. In general, the applied collector-emitter voltage may be raised until the collector-base junction breakdown voltage is reached. It will be appreciated by those skilled in the art that this voltage, $BV_{CBO}$, is greater than what would be the predicted collector-emitter breakdown voltage $BV_{CEO}$.

In the usual transistor the depletion region, or space charge region of uncovered ions where majority carriers have been removed by applied voltage, extends only part way across the collector region. With further increases in collector-emitter voltage, depletion increases, and the field intensity resulting therefrom increases whereby carriers traversing the region receive more and more energy until breakdown is reached. The collector-emitter breakdown voltage $$BV_{CEO}=\frac{BV_{CBO}}{\sqrt[n]{\beta}}$$

where $BV_{CBO}$ is the collector-base junction avalanche breakdown voltage, $\beta$ is a characteristic of the transistor, and $n$ has a range of approximately two to five. Values for these factors are available or can be determined for a given type of transistor construction.

The field strength in the collector layer is dependent upon uncovered charge. i.e., the electric field, $$\epsilon=\int_{X_1}^{X_2}\frac{\rho}{\epsilon}dx=-\int_0^x\frac{qN_D}{\epsilon}dx$$

where $\rho$ is charge, $\epsilon$ is the dielectric constant of the semiconductor, here silicon, and $N_D$ is impurity density, here N type impurity density, in atoms per cubic centimeter. $x$ is measured upwardly from junction 15. Further, $$\epsilon=-\frac{qN_D}{\epsilon}x$$

since $N_D$ is assumed to be a constant in the collector layer.

Now, assume complete depletion or uncovering of charge in the collector layer. V, the collector-emitter applied voltage, then equals the positive integral of $\epsilon dx$ and therefore equals $$-\int_0^t\frac{qN_{D_x}}{\epsilon}$$

Thus, $$V=\frac{qN_D}{2\epsilon}t^2$$

where $t$ is the thickness of the active collector layer in centimeters, and $q$ is the charge on an electron.

This relation also assumes the base is disconnected, or the most unfavorable condition as far as the possibility of collector-emitter breakdown is concerned. The relation indicates the voltage at which virtually complete depletion of majority carriers takes place for uncovering charge across a thickness $t$ by removal of such carriers. Providing this voltage is less than a voltage at which collector-emitter breakdown can take place, then the voltage may be raised still further without further accelerating minority carriers in the collector inasmuch as a further increase in collector-emitter voltage cannot increase the field intensity in the same region any more. The field intensity is at the maximum value it can reach. Thus, the space charge layer width and field intensity have been limited.

Moreover, since the charge on either side of the collector-base junction must be equal, the spread of the space-charge on the base side of the junction is prevented, even though the applied voltage is raised. Therefore, the space charge layer on the base side, as indicated at 42 in FIG. 1, will remain the same in thickness and will never reach the emitter-base junction 30. The "top" of space charge layer 42 becomes stationary before reaching the emitter. Thus, breakdown due to "punch-through" is also avoided.

Then in order to avoid premature breakdown, the thickness, $t$, in centimeters in FIG. 1 should be less than $$\sqrt{\frac{2\epsilon V}{qN_D}}$$

where V is now taken to be the characteristic collector-emitter breakdown voltage for the device or $$BV_{CEO}=\frac{BV_{CBO}}{\sqrt[n]{\beta}}$$

as given above. Under these circumstances, depletion of the active collector region will take place before the collector-emitter breakdown voltage for the device is reached, and the collector-emitter voltage can then be raised past the usual breakdown voltage. It should also be appreciated that the doping $N_D$ can be varied, which will affect the desired thickness. A change in doping in effect changes the resistivity of the collector region. The resistivity or doping is suitably controlled in combination with the thickness to result in the proper voltage for complete charge depletion below the breakdown value.

The sidewalls of the collector-base junction will not be affected by the field limiting mechanism. However, collector-emitter breakdown does not occur here for either of two reasons: first, transistor action in this region is poor, and second, nearly all minority carriers are injected at the bottom of the emitter-base junction. The "active" collector region for which $t$ is defined is that region below or juxtaposed with the emitter-base junction.

The discussion thus far has neglected the effect of the collector-substrate bias, provided in the illustrated embodiment by battery 38. This bias will bring about a collector-substrate depletion region or space charge layer, as indicated in FIG. 1, which adjoins the collector-base space charge layer, as also labeled in FIG. 1. Thus, the "effective" thickness of the collector region is ordinarily not $t$, but rather $t_1$ in FIG. 1, that is, the distance between the boundary of the collector-substrate space charge layer and the collector-base junction 20. Since the desired thickness, $t$, predicted by the above formulae is frequently quite narrow, a collector-substrate bias is advantageously employed so that a thickness $t_1$ is electrically controllable. In this case $t_1$ is substituted for $t$ in the foregoing expressions. It is much easier to reduce $t_1$ to a small value by means of adjusting the collector-substrate bias. For a given thickness, the collector-emitter voltage at which substantially complete depletion in the collector occurs is lowered. Also, the maximum current the device will pass is determined by the relatively low carrier density in the thus-constricted collector region. In most cases the collector current can be entirely pinched off with sufficient reverse bias on the collector-substrate junction. Therefore, the effective thickness $t_1$ can be varied by varying the collector-substrate bias until the desired thickness is attained, which will predict virtually complete depletion of charge in the collector at a voltage less than collector-emitter breakdown voltage.

Figure 3:
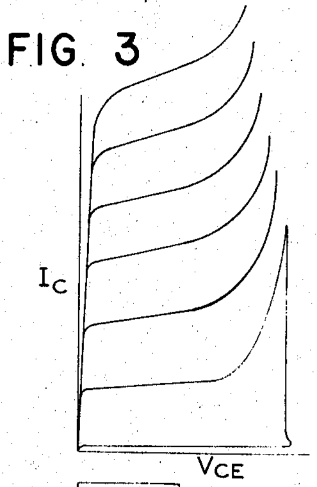
FIG. 3 is a plot of D.C. common-emitter characteristics for a similar transistor employing a buried layer, wherein the voltage and current scales are the same as in FIG. 2.

FIGS. 2 and 3 illustrate the D.C. characteristics, plotting collector current versus collector-emitter voltage, for two similar integrated transistors. The $BV_{CBO}$ of the devices are identical, that is, the collector-base breakdown voltages of these devices are identical. However, the device of FIG. 3 is provided with a buried layer whereby depletion in the collector region is not procured due to the charge carriers available from the buried layer. In the FIG. 2 device, no buried layer is present, and the thickness and doping of the collector are such that virtually complete charge depletion in the collector takes place. Breakdown is indicated at the right hand extremities of the curves in each instance, which are plotted for various values of base current). It is seen that breakdown occurs in the buried layer device illustrated in FIG. 3 much before the device for which the characteristics are plotted in FIG. 2. The $BV_{CEO}$ of the device, the characteristics of which are plotted in FIG. 3, is less than half of the $BV_{CEO}$ of the device the characteristics of which are portrayed in FIG. 2.

Another significant difference is also evident in that the output impedance of the device of FIG. 2 is much greater as indicated by the flatter curves. This is the result of limiting the collector-base space charge layer width in the active base, thus eliminating collector current variations due to base-width modulation. That is, the top of the space charge layer 42 is fixed, and does not move up and down with changes in collector-emitter voltage.

Figure 4:
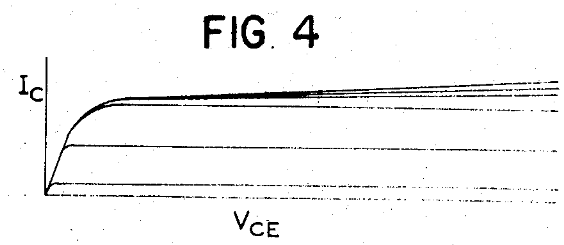
FIG. 4 is a plot of D.C. common-emitter characteristics for a different value of substrate collector bias for the FIG. 1 transistor, with the voltage and current scales being the same as in FIGS. 2 and 3.

The curves for FIG. 4 were taken from the same device as were the curves in FIG. 2. However, a much higher substrate bias is applied in the instance of the device operated in the manner illustrated in FIG. 4. Since the maximum current in the device is determined by the relatively low carrier density in the constricted collector region, the collector current attains a substantially maximum value regardless of changes in base current.

It should be understood that an NPN transistor device is illustrated by way of example, and that the invention is also applicable to PNP devices.

While I have shown and described preferred embodiments of my invention, it will be apparent to those skilled in the art that many changes and modifications may be made without departing from my invention in its broader aspects. I therefore intend the appended claims to cover all such changes and modifications as fall within the true spirit and scope of my invention.

I claim:

1. A transistor device comprising:

an integrated circuit substrate of first conductivity type material and a collector providing layer of a second conductivity type material disposed on a single side of the substrate with one side of said layer forming a PN junction with the substrate, said layer, having the other side, disposed opposite the substrate, containing a base region of first conductivity type material and an emitter region of second conductivity type material within the base region with surfaces exposed at said other side of the layer, said layer having means for depletion of virtually all majority carriers from the active collector region thereof between said base region and substrate upon application of a collector-emitter voltage less than the collector-emitter breakdown voltage value for the device with the base open circuited.

2. The transistor device according to claim 1 wherein restriction of the thickness and resistivity of the active collector region produces said depletion upon application of a voltage below the collector-emitter breakdown voltage for the device.

3. The transistor device according to claim 1 wherein said active collector region has a thickness, $t$, measured in centimeters less than $$\sqrt{\frac{2\epsilon V}{qN}}$$

wherein $\epsilon$ is the dielectric constant of the collector semiconductor material, $q$ is the charge of an electron, N is the substantially constant impurity densiy of the collector semiconductor material, and V is the voltage for collector-emitter breakdown of said device without restriction in thickness of said collector region, whereby the active collector region is substantially depleted of majority carriers upon application of a voltage below the value for collector-emitter breakdown of the device.

4. The transistor device according to claim 3 wherein said PN junction with said substrate is back-biased to provide a second depletion region in the collector the edge of which defines one boundary of the active collector region, $t$ being measured from such boundary to the collector-base junction.

5. The transistor device according to claim 3 wherein the base region is more heavily doped than the collector region.

6. The transistor device according to claim 3 wherein said layer comprises semiconductor material epitaxially grown on the substrate and appropriately doped to provide said regions.

7. The transistor device according to claim 3 in which such substantial depletion takes place in the collector region before the collector-base space charge layer in the base region extends to the emitter region.

References Cited

UNITED STATES PATENTS 3,404,295 10/1968 Warner ------------ 307—302

JAMES D. KALLAM, Primary Examiner

U.S. Cl. X.R.

317—234

UNITED STATES PATENT OFFICE

CERTIFICATE OF CORRECTION

Patent No. 3,564,356 Dated February 16, 1971

Inventor(s) George R. Wilson

It is certified that error appears in the above-identified patent and that said Letters Patent are hereby corrected as shown below:

Col. 1, line 23, after "collector-base" insert -- space -

Col. 2, line 34, "substare" should be -- substrate --

Col. 3, lines 47 and 48, at the beginning of the formula, "$\epsilon$" should be -- $\mathcal{E}$ --

Col. 3, lines 53 and 54, at the beginning of the formula, "$\epsilon$" should be -- $\mathcal{E}$ --

Col. 3, line 59, "$\epsilon$dx" should be -- $\mathcal{E}$dx --

Col. 3, lines 62 and 63, immediately following the formul insert -- dx --

Col. 5, line 15, after "instance" the comma (,) should be -- ( --.

Signed and sealed this 21st day of December 1971.

(SEAL)
Attest:

EDWARD M.FLETCHER,JR.
Attesting Officer

ROBERT GOTTSCHALK
Acting Commissioner of Pa